US007554069B2

(12) United States Patent  
Harada

(10) Patent No.: US 7,554,069 B2
(45) Date of Patent: Jun. 30, 2009

(54) SOLID STATE IMAGING DEVICE AND IMAGING APPARATUS HAVING A FIRST WELL REGION FORMING AN OVERFLOW BARRIER INTERPOSED BETWEEN A PHOTOELECTRIC CONVERSION AREA AND A SECOND WELL REGION

(75) Inventor: Kouichi Harada, Kanagawa (JP)

(73) Assignee: Sony Corpration (JP)

( * ) Notice: Subject to any disclaimer, the term of this patent is extended or adjusted under 35 U.S.C. 154(b) by 0 days.

(21) Appl. No.: 12/071,209

(22) Filed: Feb. 19, 2008

(65) Prior Publication Data

US 2008/0203278 A1 Aug. 28, 2008

(30) Foreign Application Priority Data

Feb. 23, 2007 (JP) ............................. 2007-044447

(51) Int. Cl.
 *H01L 27/00* (2006.01)
(52) U.S. Cl. ..................................... 250/208.1; 250/239
(58) Field of Classification Search .............. 250/208.1, 250/214 R, 239; 257/223–230, 440, 445, 257/461, 290–292; 348/283–308
See application file for complete search history.

(56) References Cited

U.S. PATENT DOCUMENTS 5,898,195 A * 4/1999 Harada ....................... 257/223

FOREIGN PATENT DOCUMENTS

| JP | 06-053474 | 2/1994 |
|---|---|---|
| JP | 2000-174250 | 6/2000 |
| JP | 2001-015729 | 1/2001 |
| JP | 2004-165462 | 6/2004 |
| JP | 2004-356157 | 12/2004 |
| JP | 2005-051136 | 2/2005 |
| JP | 2006-073804 | 3/2006 |
| JP | 2006-229107 | 8/2006 |

OTHER PUBLICATIONS

Japanese Office Action issued Mar. 10, 2009 for corresponding Japanese Application No. 2007-044447.

* cited by examiner

*Primary Examiner*—Que T Le
(74) *Attorney, Agent, or Firm*—Rader Fishman & Grauer PLLC; Ronald P. Kananen

(57) ABSTRACT

A solid state imaging device having an image area in which a plurality of light receiving pixels is arranged on a semiconductor substrate of a first conductive type is disclosed. The device includes: a plurality of photosensor parts formed by providing on the semiconductor substrate a light receiving area and a photoelectric conversion area both configuring the light receiving pixel; a first well region formed on the opposite side of the light receiving area, having a second conductive type opposite to the first conductive type, and forming an overflow barrier; a second well region of the second conductive type formed in an area except a place corresponding to the photosensor part on the opposite side of the photoelectric conversion area; and a first conductive region formed in an area corresponding to the photosensor part on the opposite side of the photoelectric conversion area.

8 Claims, 9 Drawing Sheets

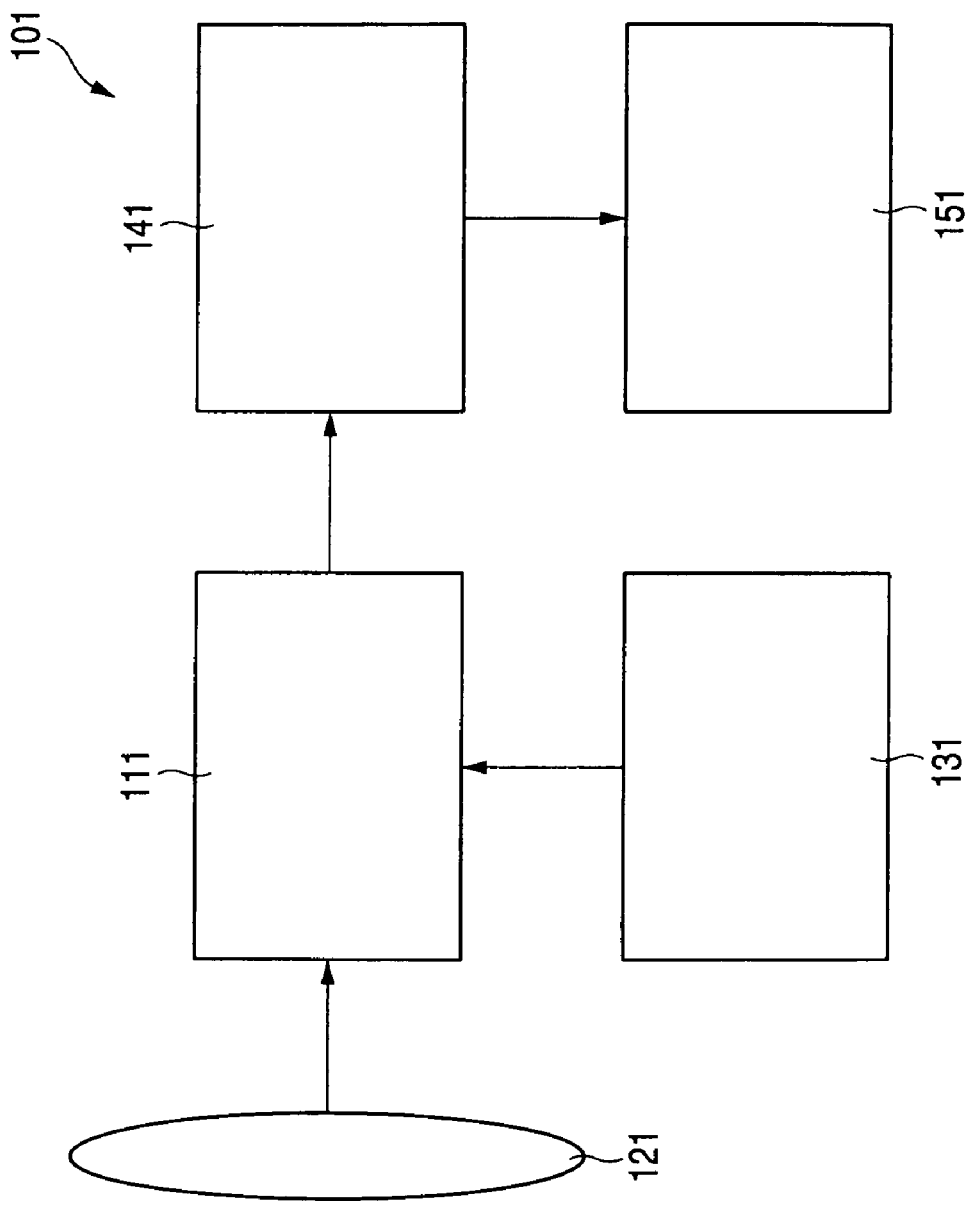

SOLID STATE IMAGING DEVICE AND IMAGING APPARATUS HAVING A FIRST WELL REGION FORMING AN OVERFLOW BARRIER INTERPOSED BETWEEN A PHOTOELECTRIC CONVERSION AREA AND A SECOND WELL REGION

CROSS-REFERENCES TO RELATED APPLICATIONS

The present invention contains subject matter related to Japanese Patent Application JP 2007-044447 filed in the Japanese Patent Office on Feb. 23, 2007, the entire contents of which are incorporated herein by reference.

BACKGROUND OF THE INVENTION

1. Field of the Invention

The present invention relates to a solid state imaging device and an imaging apparatus.

2. Description of the Related Art

Heretofore, a vertical overflow drain solid state imaging device has been proposed in which excess electrons in a light receiving part are drained to the substrate side and excess holes are evacuated to a ground part (GND) from a channel stop part provided around individual photosensors on the substrate surface through a P-type region disposed at a deep place in the substrate.

Moreover, a structure has been disclosed in which excess holes are partially drained to GND out of a channel stop part around individual photosensors on the substrate surface (hereinafter, referred to as a route A), the remaining excess holes are moved in an overflow barrier area, the excess holes are transferred to the outer part of a solid state imaging device through the overflow barrier area and the holes are evacuated to the GND connected to the outer part (hereinafter, referred to as a route B) (for example, see Patent Reference 1 (JP-A-2001-15729)). In the case of this structure, since a voltage drop occurs in a place apart from the ground part, holes are delayed to migrate in the photosensor, and the overflow barrier potential on route B fluctuates in the surrounding area and the center part of an effective imaging area to cause shading in saturated signal electrons, which leads to a degraded image quality of a taken image. In other words, in order to solve this problem, it is necessary to reduce the resistance in the overflow barrier area on the route B that is the path of the excess holes to suppress the voltage drop caused by holes passing through the route B and to suppress the overflow barrier potential from fluctuating in the center part and the surrounding area of the image area.

In order to reduce the resistance in the overflow barrier area, increasing the impurity concentration in the overflow barrier area has been considered. However, in this case, it is difficult to empty the overflow barrier area because the overflow barrier area is neutralized, which leads to a problem of blooming when a large light quantity enters.

On the other hand, in the case in which the impurity concentration in the overflow barrier area is decreased, the overflow barrier area can be emptied out because the potential in the overflow barrier area rises, and thus the problem of blooming when a large light quantity enters can be improved. However, this causes a problem that the resistance in the overflow barrier area is increased to cause shading when a large light quantity enters.

In other words, for the invention described in Patent Reference 1, since there are trade-offs between the overflow barrier area being emptied out and a reduced resistance, there is a problem that it is difficult to suppress both the shading and blooming in saturated signal electrons.

On the other hand, in the solid state imaging device, with the scale down of the pixel size because of the advance in multipixels and miniaturization, the spacings between pixels in the vertical direction and in the horizontal direction are increasingly narrowed. On this account, in the structure of the channel stop areas formed only on the surface of a semiconductor substrate, it is difficult to efficiently prevent a phenomenon of photoelectrically converted electric charges mix into the adjacent pixels in the photosensor part (hereinafter, referred to as color mixture). Therefore, in order to prevent this color mixture, it is necessary to form a P-type region below the channel stop area between pixels and a vertical charge transfer part (in the vertical charge transfer part, the area deeper from the semiconductor substrate surface than the vertical charge transfer channel formed in an N-type region) to a deeper area in the semiconductor substrate in the depth direction.

Then, a method is disclosed in which a P-type impurity to form a channel stop area is formed by using a plurality of ion injections with different injection energies (for example, see Patent Reference 2 (JP-A-2004-165462)). However, in the case of using this method, the impurity concentration becomes non-uniform in the depth direction, and is difficult to form a channel stop area of uniform impurity concentration to a deeper area. In addition, when the pixel size is scaled down, a so-called narrow channel effect occurs in which a $P^+$-diffusion layer configuring the channel stop area around each of the photosensors narrows the path of electric charges.

In the case of using the method described in Patent Reference 2, as described above, the impurity concentration of the channel stop area becomes non-uniform in the depth direction, and in addition to this, the narrow channel effect occurs causing the potential in the area to drop, and the minimum point of the potential in the overflow barrier area is shifted to a position shallow from the substrate surface.

Therefore, in the case in which the pixel size is small, it is difficult to form the overflow barrier area in a position deep from the substrate surface. In addition, desirably, the overflow barrier area is formed in a position deeper to some extent from the substrate surface in order to widen the area to be photoelectrically converted by the light incident into the photosensor for improved sensitivity. However, as described above, in the case in which the pixel size is small, it is difficult to form the overflow barrier area at a deep position, which leads to a problem that it is difficult to allow a solid state imaging device to have higher sensitivity.

Moreover, when the channel stop area becomes non-uniform in the depth direction, the potential becomes wavy in the depth direction, which is not preferable to drain excess holes out of the channel stop area to the front surface side of the substrate.

The problems of difficulty in higher sensitivity and the a nonuniform channel stop area becomes particularly problematic when the pixel size is 2 µm or below.

In addition, the method described in Patent Reference 2 has a problem that the number of process steps is increased. Moreover, it is necessary to form a thicker ion injection mask formed of a resist because it is necessary to form the channel stop part by high energy ion implantation, which causes a difficulty of microprocessing a thick resist film, which also leads to a problem that it is difficult to form pixels finer.

In addition, Patent Reference 1 discloses the invention in which such a structure is formed that the channel stop part is formed from the silicon substrate surface to a deeper position than the photosensor, whereby holes to be moved along the route B are partially drained from the channel stop part formed at a deeper part to the GND on the front surface side of the substrate (route C).

As described above, in the case in which the pixel size is scaled down, the sensitivity is also dropped even though the method described in Patent Reference 2 is used, and thus the sensitivity is dropped even though the method is adapted to the invention described in Patent Reference 1. Therefore, in this case, it is difficult to attain the prevention of a color mixture as well as a higher sensitivity. Thus, in the case in which the method described in Patent Reference 2 is adapted to the invention described in Patent Reference 1, there is a problem that it is difficult to scale down the pixel size.

On the other hand, for a scheme of preventing the sensitivity from being dropped in the case in which the pixel size is scaled down, electric charges obtained by photoelectric conversion in the area other than the light receiving part, that is, electric charges obtained below the vertical transfer part can be considered for use as signal electric charges. In order to allow electric charges obtained by photoelectric conversion below the vertical transfer part for use as signal electric charges as well, for example, Patent Reference 3 (JP-A-2004-356157) discloses a structure in which a twin P-well structure is formed such that a second P-well region is formed below the first P-well region through an N⁻-type impurity area. A channel stop part for pixel separation is also formed deeper in the position of the second P-type well region and is electrically connected to the P-type well region. Also, in this case, it is necessary to form the channel stop part deeper. On this account, even though the method described in Patent Reference 3 is adapted, it has a problem similar to the case in which the method described in Patent Reference 2 is adapted to the invention described in Patent Reference 1 as described above.

SUMMARY OF THE INVENTION

It is desirable to solve the problem that in the case in which the pixel size is scaled down, it is difficult to prevent a color mixture as well as to achieve a higher sensitivity.

It is also desirable to prevent color mixing, to achieve a-higher sensitivity, and to scale down the pixel size.

A solid state imaging device according to an embodiment of the invention is a solid state imaging device having an image area in which a plurality of light receiving pixels is arranged on a semiconductor substrate of a first conductive type. The solid state imaging device includes: a plurality of photosensor parts formed by providing on the semiconductor substrate a light receiving area and a photoelectric conversion area both configuring the light receiving pixel; a first well region formed on the opposite side of the light receiving area with the photoelectric conversion area of the photosensor part being interposed therebetween, having a second conductive type opposite to the first conductive type, and forming an overflow barrier; a second well region of the second conductive type formed in an area except a place corresponding to the photosensor part on the opposite side of the photoelectric conversion area with the first well region being interposed therebetween; and a first conductive region formed in an area corresponding to the photosensor part on the opposite side of the photoelectric conversion area with the first well region being interposed therebetween.

In the solid state imaging device according to the embodiment of the invention, since the second well region is formed in the area except the place corresponding to the photosensor part, a color mixture can be prevented even though the pixel size is scaled down. In addition, the dependency of sensitivity and spectral response on the voltage Vsub to be applied can be improved. In other words, since the second well region exists at a position deeper than the first well region, even though the voltage Vsub is increased, the position of the minimum value of potential is in the first well region and is not shifted to the position near the photosensor part. Thus, a higher sensitivity, as well as an improved dependency of sensitivity and spectral response on the voltage Vsub to be applied can be implemented. Accordingly, even though the pixel size is scaled down, a color mixture can be prevented, and a higher sensitivity as well as an improved dependency of sensitivity and spectral response on the voltage Vsub to be applied can be implemented.

An imaging apparatus according to an embodiment of the invention is an imaging apparatus including a solid state imaging device as an imaging device, wherein the solid state imaging device has; an image area in which a plurality of light receiving pixels is arranged on a semiconductor substrate of a first conductive type; a plurality of photosensor parts formed in which a light receiving area and a photoelectric conversion area both configuring the light receiving pixel are provided on the semiconductor substrate; a first well region formed on the opposite side of the light receiving area with the photoelectric conversion area of the photosensor part being interposed therebetween, having a second conductive type opposite to the first conductive type, and forming an overflow barrier; a second well region of the second conductive type formed in an area except a place corresponding to the photosensor part on the opposite side of the photoelectric conversion area with the first well region being interposed therebetween; and a first conductive region formed in an area corresponding to the photosensor part on the opposite side of the photoelectric conversion area with the first well region being interposed therebetween.

In the imaging apparatus according to the embodiment of the invention, the solid state imaging device according to the embodiment of the invention is used for the imaging device. Thus, even though the pixel size is scaled down, the color mixture can be prevented, and a higher sensitivity as well as an improved dependency of sensitivity and spectral response on the voltage Vsub to be applied can be implemented.

In accordance with the solid state imaging device according to the embodiment of the invention, even though the pixel size is scaled down, a color mixture can be prevented, and a higher sensitivity as well as an improved dependency of sensitivity and spectral response on the voltage Vsub to be applied can be implemented. Therefore, the advantages of a higher definition and a higher image quality of taken images are possible.

In accordance with the imaging apparatus according to the embodiment of the invention, even though the pixel size of the solid state imaging device used for the imaging device is scaled down, the color mixture can be prevented, and a higher sensitivity as well as an improved dependency of sensitivity and spectral response on the voltage Vsub to be applied can be implemented. Thus, advantages of having a higher definition and a higher image quality of taken images are possible.

BRIEF DESCRIPTION OF THE DRAWINGS

FIG. 9 shows a block diagram depicting the schematic configuration of an imaging apparatus according to the embodiment of the invention.

DETAILED DESCRIPTION OF THE INVENTION

A solid state imaging device according to an embodiment (first embodiment) of the invention will be described with reference to cross sections shown in FIGS. 1, 2 and 3 and plan layout diagrams shown in FIGS. 4 and 5. Moreover, FIG. 1 shows a diagram depicting a X-X' schematic cross section in FIG. 4, and FIG. 2 shows a diagram depicting a Y-Y' schematic cross section in FIG. 4.

Figure 1:
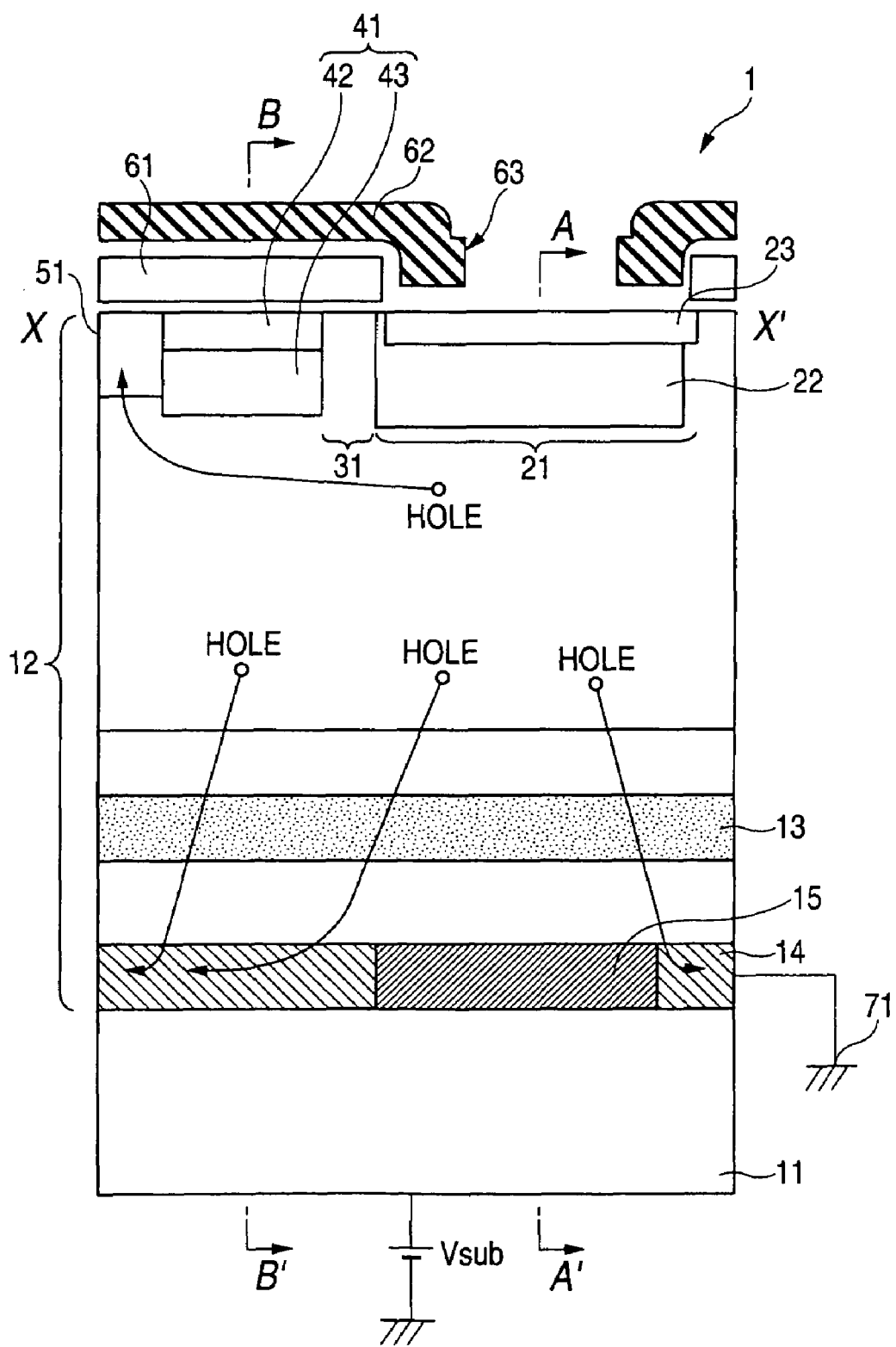
FIG. 1 shows a cross section depicting the schematic configuration of a light receiving pixel of a solid state imaging device according to an embodiment (first embodiment) of the invention (an X-X' schematic cross section in FIG. 4)
Figure 2:
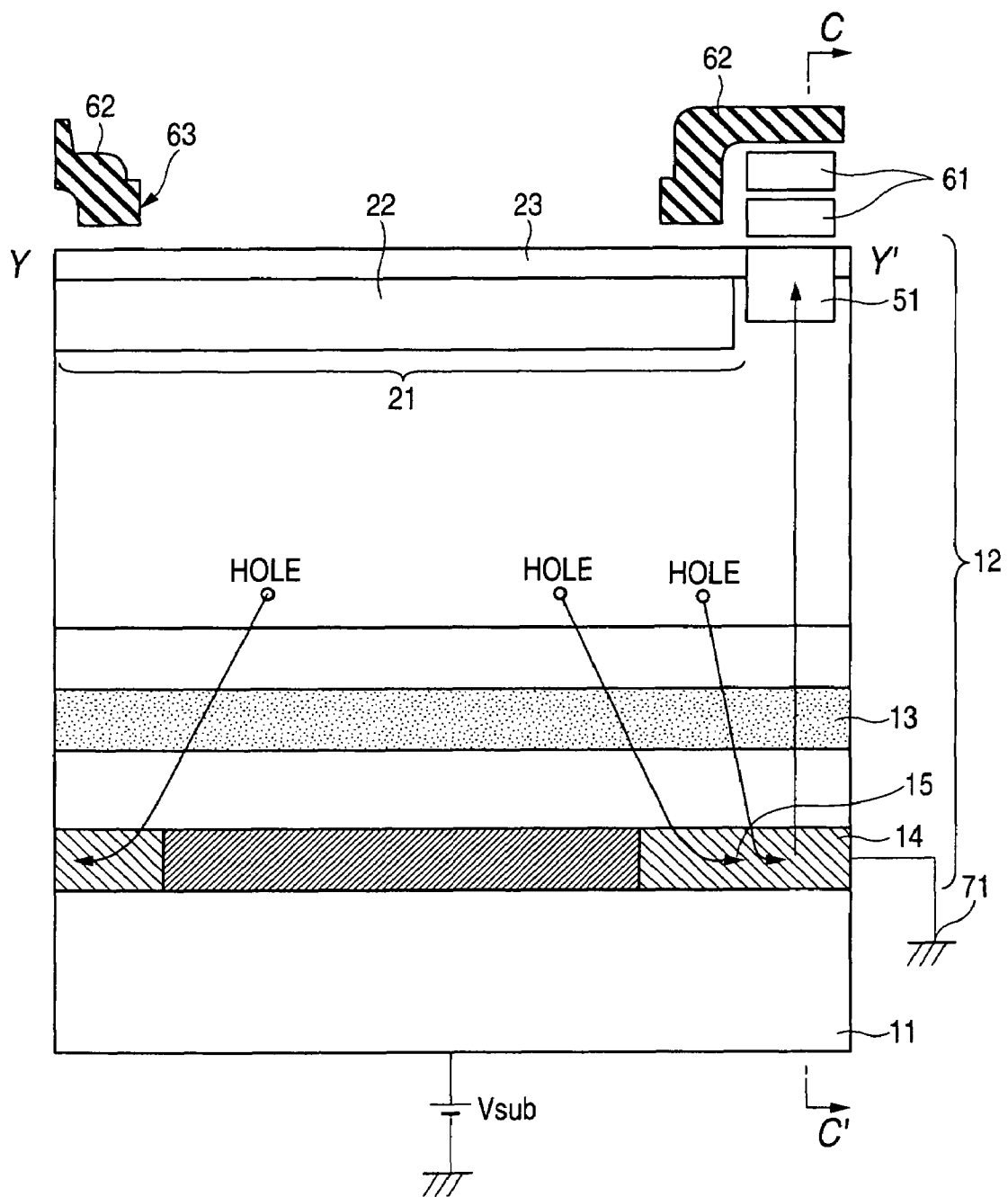
FIG. 2 shows a cross section depicting the schematic configuration of the light receiving pixel of the solid state imaging device according to the embodiment (first embodiment) of the invention (a Y-Y' schematic cross section in FIG. 4)
Figure 3:
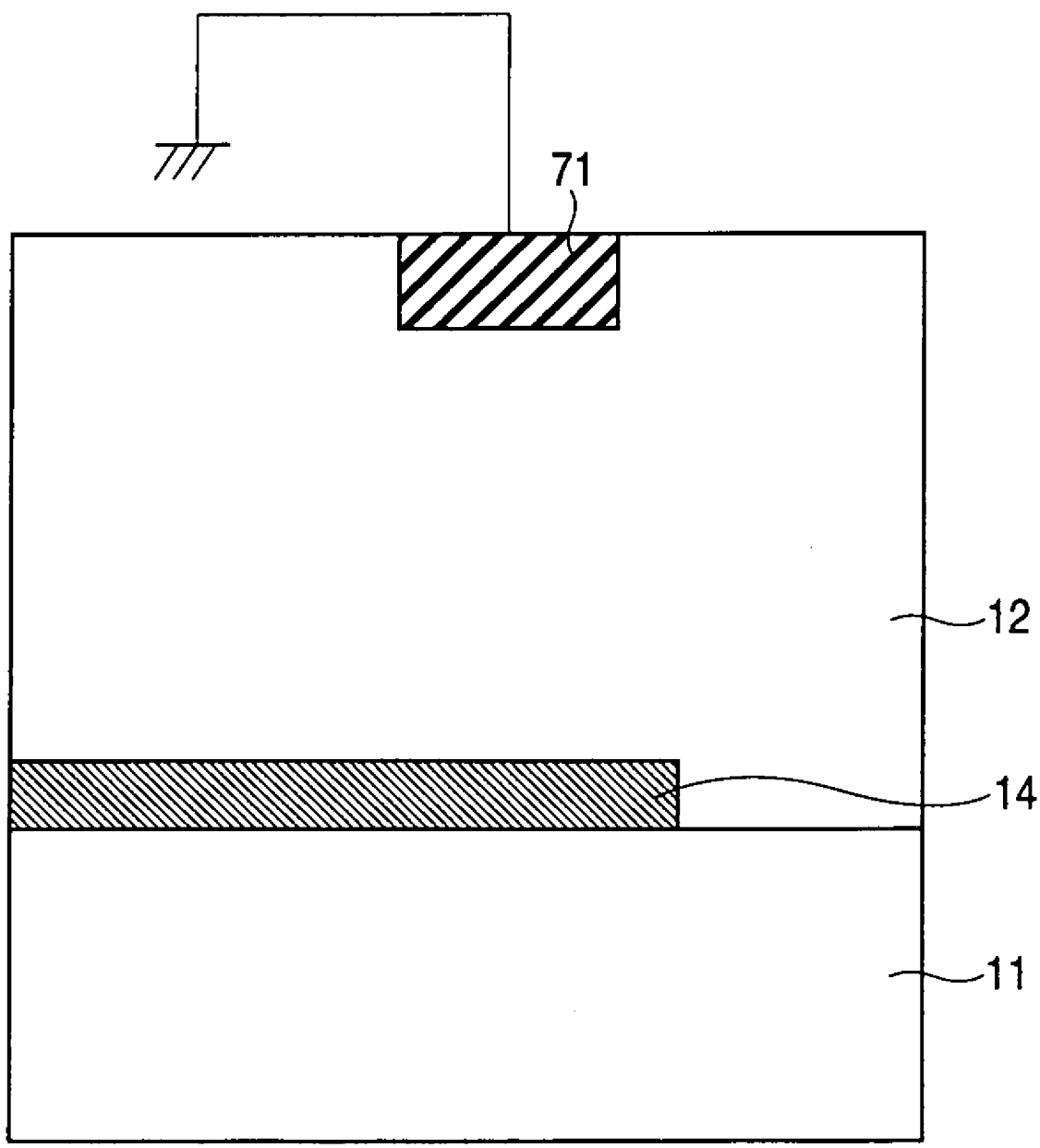
FIG. 3 shows a cross section depicting the schematic configuration of the vicinity of a ground part of the solid state imaging device according to the embodiment of the invention.
Figure 4:
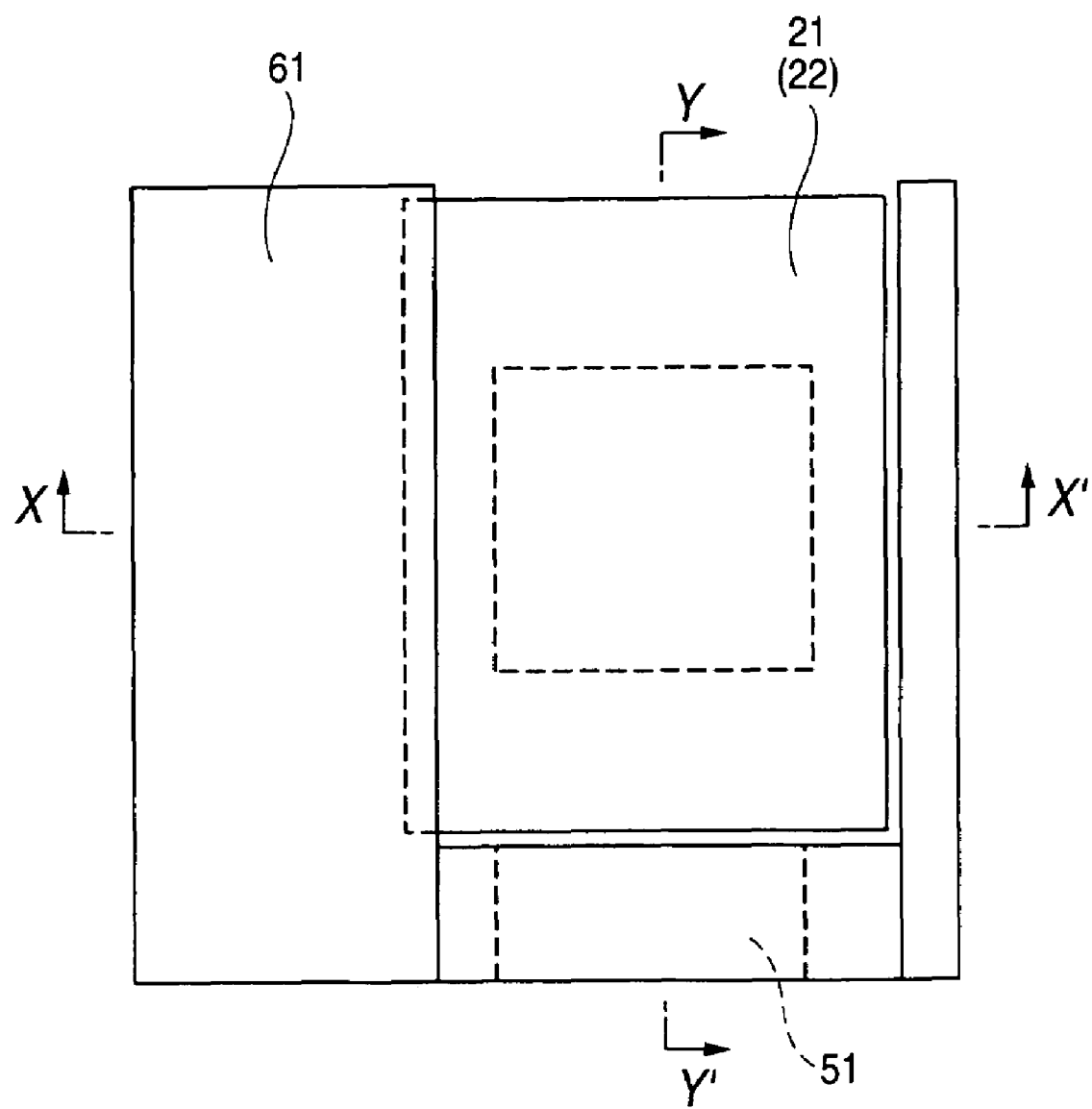
FIG. 4 shows a layout diagram depicting the light receiving pixel of the solid state imaging device according to the embodiment (first embodiment) of the invention.

In addition, FIGS. 1, 2, and 4 shows a diagram schematically depicting the vicinity of a single light receiving pixel among a plurality of light receiving pixels provided in an image area of a solid state imaging device according to the embodiment of the invention. FIG. 3 shows a cross section depicting the schematic configuration of the vicinity of a ground part provided on the outer part of the image area of the solid state imaging device according to the embodiment of the invention. FIG. 5 shows a layout diagram schematically depicting the image area of the solid state imaging device and the vicinity of the ground part on the outer part thereof.

As shown in FIGS. 1, 2, and 4, on a semiconductor substrate 11 of a first conductive type (N-type, hereinafter, the first conductive type will be described as an N-type), an epitaxial region 12 is formed as the area of a second conductive type (P⁻-type, hereinafter, the second conductive type will be described as a P-type). The epitaxial region 12 is formed by epitaxial growth using CVD. In the epitaxial region 12, a first well region 13 of the second conductive type is formed that is an overflow barrier with a higher impurity concentration than that of the epitaxial region 12. The first well region 13 is formed by ion injection.

In addition, on the surface on the opposite side of the semiconductor substrate 11 in the epitaxial region 12, a photosensor part 21 is formed that photoelectrically converts the light incident into the solid state imaging device 1. The photosensor part 21 is configured of a photoelectric conversion area 22 formed of an N-type region and a light receiving area 23 that is a hole accumulation layer formed of a $P^+$-type region formed on the front layer of the photoelectric conversion area 22.

On one side of the photosensor part 21 (in FIG. 1), a vertical charge transfer part 41 is formed through a readout part 31. The vertical charge transfer part 41 is formed of an N-type region 42 and a P-type region 43 thereunder. Moreover, on one side of the vertical charge transfer part 41 (opposite side of the readout part 31), a channel stop area 51 formed of a P-type region is formed. In addition, a channel stop area (not shown) is also formed on the other side of the photosensor part 21 (in FIG. 1).

On the semiconductor substrate 11, apart from the first well region 13, a second well region 14 of the second conductive type (P-type) that has a higher impurity concentration than that of the first well region 13 is formed. In other words, on the opposite side of the photoelectric conversion area 22 with the first well region 13 being interposed therebetween, the second well region 14 is formed. Therefore, between the first well region 13 and the second well region 14, a part of the epitaxial region 12 exists as the second conductive type region. The second well region 14 is formed by ion injection.

Figure 5:
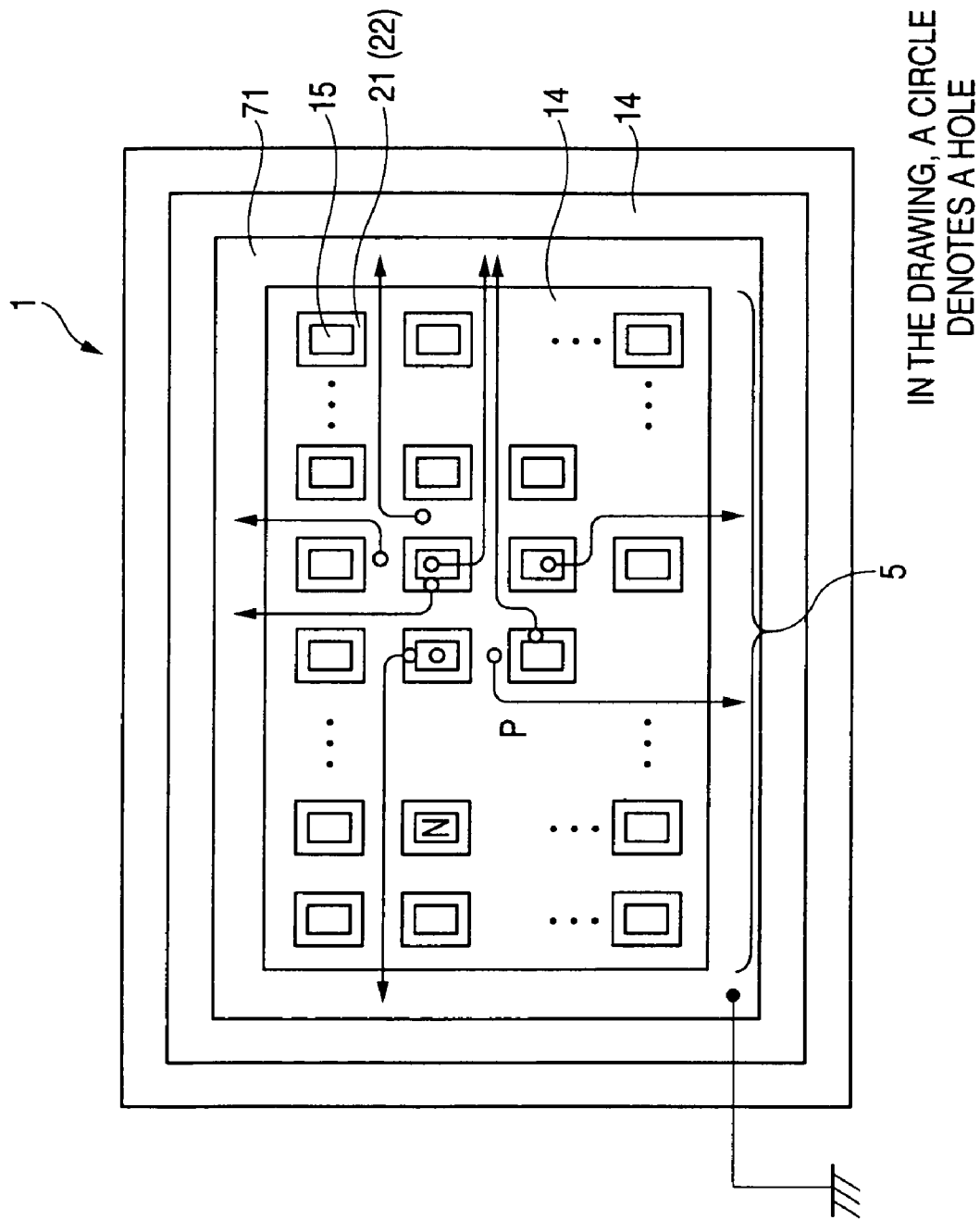
FIG. 5 shows a layout diagram of the solid state imaging device according to the embodiment (first embodiment) of the invention, schematically depicting an image area of the solid state imaging device and the vicinity of the ground part in the surrounding area thereof.

In addition to this, as shown in FIGS. 3 and 5, in the solid state imaging device 1, the image area 5 is provided in which the photosensor parts 21 are arranged in a matrix, and a ground part 71 is provided in the outer part of the image area 5.

Then, as shown in FIGS. 1, 2, and 4, the second well region 14 is formed so as to leave out the places corresponding to the photosensor parts 21. In other words, the second well region 14 is formed so as to leave out the areas in which the area functioning as the photosensor part 21 (for example, the light incident area of the light receiving area 23) is projected downward.

Therefore, the second well region 14 is formed in a mesh in the area corresponding to the image area 5, in which a plurality of the photosensor parts 21 is formed in a matrix. It is sufficient that the second well region 14 is formed so as to leave out the places corresponding to the photosensor parts 21. In the area in which the second well region 14 formed in a mesh is not provided, a first conductive region 15 is formed. For the shape of the area in which the first conductive region 15 is formed, various shapes, such as a rectangle, a circular shape, an oval, and an ellipse, can be adopted.

In addition, the size of the first conductive region 15 is not restricted to a size smaller than the size of the photosensor part 21. The size thereof may be the size of the area in which the area greater than the photosensor part 21 (for example, the area including the photosensor part 21 as well as parts of the readout part 31 and the channel stop area 51) is projected downward.

In addition, the second well region 14 may not be in a mesh. The second well region 14 may have the area in lines in which the second well region 14 is not formed so as to correspond to the rows or columns of the photosensor parts 21 adjacent to each other in the row direction or in the column direction. Then, as shown in FIG. 1, in the case in which the second well region 14 is formed in a mesh so that the places corresponding to the photosensor parts 21 adjacent to each other become the areas in which the second well region 14 is not formed, this case is more preferable because the color mixture between the photosensor parts 21 adjacent to each other is more suppressed.

In addition, holes generated below the photosensor part 21 and holes generated except below the photosensor part 21, for example, below the vertical charge transfer part 41, flow through the second well region 14. In other words, holes pass through the second well region 14 of the second conductive type (P-type) provided around the first conductive region 15 (between the pixels) arranged at the places corresponding to the photosensor parts 21, and the holes flow into the ground part 71 provided on the outer part of the image area 5.

Moreover, the second well region 14 is provided so as to form a path in which the holes having overflowed beyond the first well region 13 are carried to the ground part 71 provided on the outer part of the image area 5. As described above, such a path is formed so that the overflowed electric charges are partially carried so as to pass through the area that is the area on the opposite side of the photoelectric conversion area 22 with the first well region 13 being interposed therebetween, except the places corresponding to the photosensor parts 21, and the overflowed electric charges are partially carried to the ground part 71.

As shown in FIGS. 1 and 2, in the embodiment, the first conductive region 15 is formed so as to bury the area in which the second well region 14 formed in a mesh is not provided, but its configuration is not restricted thereto. It is sufficient that the first conductive region 15 is formed so as to include the place corresponding to the photosensor part 21.

The second well region 14 and the first conductive region 15 may have different depths from the substrate surface. Preferably, as shown in FIG. 1, they have the same depth.

Moreover, hereinafter, the term "substrate surface" is substantially referred to as the surface of the epitaxial region 12. In the case in which the depth from the substrate surface is the same depth, excess holes are carried to the second well region 14, and the holes evacuate from the ground part 71 provided on the outer part of the image area 5. Thus, the excess electric charges can be more effectively drained to the semiconductor substrate 11 side through the first conductive region 15. On the other hand, in the case in which the first conductive region 15 is shallower or deeper than the second well region 14, the impurity (P-type) in the second well region 14 is diffused into the area in which the second well region 14 is not formed, and the potential difference between the mesh part and the area in which the second well region 14 is not formed is made small.

In addition, on the epitaxial region 12 in the readout part 31 and the vertical charge transfer part 41, an electrode (a transfer electrode and a readout electrode) 61 is formed through an insulating film (not shown). Moreover, a light shielding film 62 is formed trough an insulating film (not shown), and on the photosensor part 21, an opening 63 is formed in the light shielding film 62.

Next, a method of fabricating the solid state imaging device 1 will be described below.

First, the epitaxial region 12 of the second conductive type is formed on the surface of the semiconductor substrate 11 of the first conductive type by epitaxial growth, such as CVD. Subsequently, the first well region 13, the second well region 14, and the area 15 of the first conductive type are formed at positions at the desired depths in the epitaxial region 12 by ion injection. Then, the readout part 31, the photoelectric conversion area 22, the light receiving area 23, the P-type region 43, the N-type region 42, and the channel stop area 51 are formed near the surface of the epitaxial region 12 by ion injection. Subsequently, the insulating film, the electrode 61, and the light shielding film 62 are formed.

The second well region 14 is formed to have an impurity concentration equal to or greater than $1\times10^{16}$ cm$^{-3}$. The second well region 14 is formed to have a high impurity concentration so that it is formed to be an area having a low potential, and holes having passed the first well region 13 are allowed to flow through the second well region 14. Therefore, the holes having flowed into the second well region 14 are also allowed to flow to the ground part 71, and the holes are allowed to evacuate to outside the solid state imaging device 1 through the ground part 71. Moreover, since the second well region 14 has a high impurity concentration and a low resistance, a voltage drop that is caused by the excess holes flowing through the area can be suppressed. Therefore, since the overflow barrier potential can be prevented from fluctuating in the center part and the surrounding area of the image area 5, shading in the saturated signal electrons can be suppressed.

In addition, desirably, the second well region 14 has an impurity concentration one digit greater than that of the first well region 13. Thus, the potential difference between the first well region 13 and the second well region 14 can be formed moderately, so that the excess holes pass over the first well region 13, flow through the second well region 14, and evacuate from the ground part 71 in the outer part of the image area to outside more effectively.

Preferably, the first well region 13 has an impurity concentration of about $1\times10^{15}$ cm$^{-3}$. In the case in which the first well region 13 is formed to have this impurity concentration, the holes in the first well region 13 are emptied out and the first well region 13 effectively operates as the overflow barrier, whereby the excess electric charges generated in the photosensor part 21 are allowed to effectively evacuate to the semiconductor substrate side through the places corresponding to the photosensor parts 21, that is, through the first conductive region 15. Accordingly, blooming can be suppressed.

Preferably, the first conductive region 15 has almost the same impurity concentration as that of the second well region 14.

As described above, since the P-type region (the second well region 14) with a high impurity concentration and the N-type region (the first conductive region 15) with a high impurity concentration are both provided, the first well region 13 that is the overflow barrier area can be emptied out, blooming can be suppressed, the second well region 14 through which excess holes are carried can be an area having a low resistance, and shading in the saturated signal electrons can be suppressed.

Therefore, as described later, excess photoelectrically converted electrons are carried into the semiconductor substrate 11 through the first conductive region 15. However, in a case in which the impurity concentration of the semiconductor substrate 11 is high enough, excess electrons can be carried to the semiconductor substrate 11 through the area in which the second well regions 14 formed in a mesh are not provided, without forming the first conductive region 15 by ion injection. Therefore, in the case in which the impurity concentration of the semiconductor substrate 11 is high enough, the area in which the second well region 14 is not formed may have the same conductive type and impurity concentration as those of the semiconductor substrate 11.

Moreover, the first well region 13, as well as the second well region 14 are formed, whereby the dependency of sensitivity and spectral response on the voltage Vsub applied to the substrate can be improved. In other words, in the case of this structure in which the first well region 13 does not exist, when the voltage Vsub is increased, the position of the minimum value of potential is shifted to the position in shallower depth. On this account, the color of a taken image changes, and particularly the red color sensitivity drops. However, as in the embodiment, the first well region 13 as well as the second well region 14 are formed, whereby the dependency of the red color sensitivity on the voltage Vsub can be particularly improved.

In addition, for example, the first well region 13 is formed to have a depth of 3 μm or greater, preferably 4 μm or greater, from the surface of the epitaxial region 12. As described above, the first well region 13 that is the overflow barrier is formed at a deep position, whereby the solid state imaging device 1 can be formed with higher sensitivity.

In addition, for example, the second well region 14 and the first conductive region 15 are formed to have a depth of 4 μm or greater, preferably 5 μm or greater from the surface of the epitaxial region 12.

In addition, preferably, the second well region 14 is formed at a deeper position from the substrate surface, about 1 μm, than the first well region 13. In this case, the excess holes are carried to the second well region 14 and drained from the ground part 71 in the outer part of the image area 5 to outside more effectively.

With this structure, even though the pixel size is scaled down, the influence of the narrow channel effect can be suppressed, and the minimum value of overflow barrier potential can be maintained at a deeper position from the photoelectric conversion area 22. Therefore, even in the case of a finer pixel size, a solid state imaging device of high sensitivity can be implemented.

Figure 6:
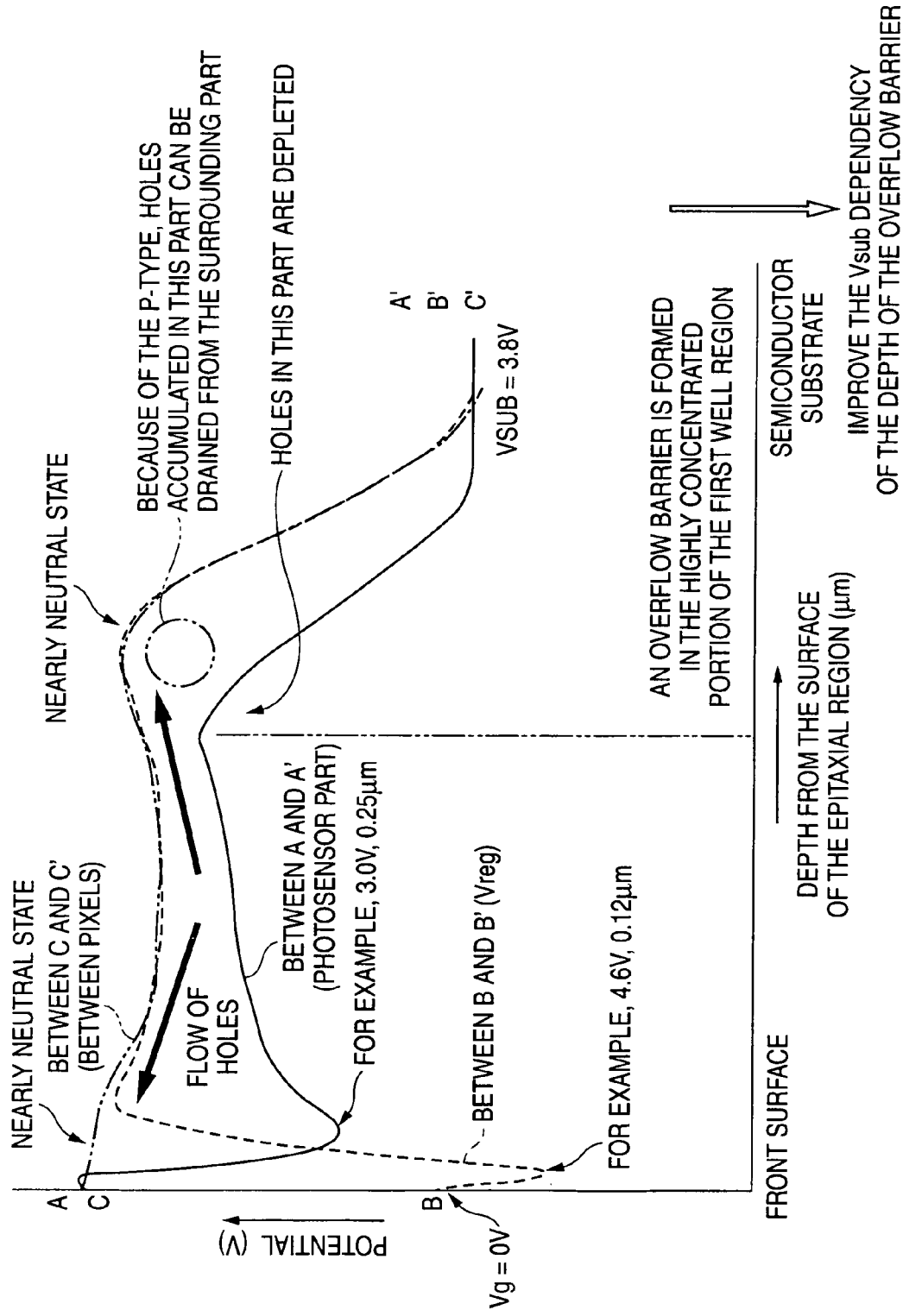
FIG. 6 shows a potential graph of line A-A' and line B-B' in FIG. 1 and line C-C' in FIG. 2.

Here, potentials on line A-A' and line B-B' in FIG. 1 and on line C-C' in FIG. 2 will be described with reference to a potential graph shown in FIG. 6. In FIG. 6, the potential is depicted on the vertical axis, and the depth from the surface of the epitaxial region 12 (the surface of the light receiving area 23) is depicted on the horizontal axis.

As shown in FIG. 6, in the solid state imaging device 1 of the configuration above, the excess holes generated below the photosensor part 21 by photoelectric conversion flow into the second well region 14. In addition, the excess holes photoelectrically converted below the vertical charge transfer part 41 or below the channel stop area 51 between the photosensor parts 21 in the vertical direction flow into the channel stop area 51 and evacuate from the substrate surface (the surface of the epitaxial region 12) side to outside, or flow into the second well region 14. Here, the holes having flowed into the second well region 14 are carried to the outer part of the image area 5 shown in FIG. 3. Since the outer part of the image area 5, the area between the second well region 14 and the ground part 71, is formed of the epitaxial region 12 that is the P-type region, the holes flow from the second well region 14 into the ground part 71 through the epitaxial region 12, and evacuate from the ground part 71 to outside.

Figure 7:
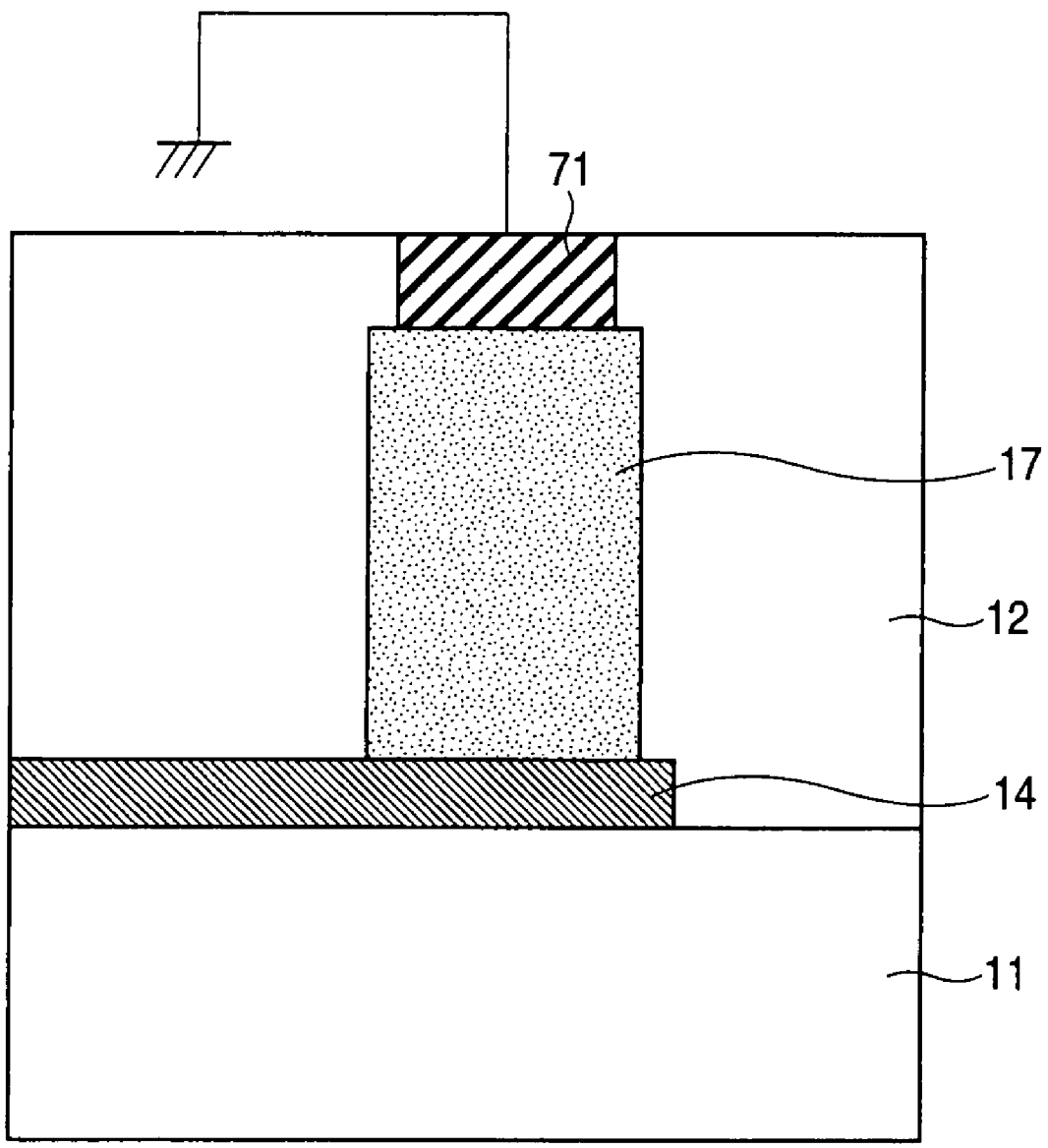
FIG. 7 shows a cross section depicting the schematic configuration of the vicinity of the ground part of the solid state imaging device according to a modification of the first embodiment of the invention.

In addition, as shown in FIG. 7, preferably, a third well region 17 is formed in the epitaxial region 12 between the second well region 14 and the ground part 71. For example, the third well region 17 is formed by ion injection to have an impurity concentration higher than that of the epitaxial region 12 to reduce its resistance, and thus the third well region 17 efficiently carries holes from the second well region 14 to the ground part 71.

In addition, as shown in FIGS. 1 and 2, since the area between the photoelectric conversion area 22 and the first well region 13, the area between the vertical charge transfer part 41 and the first well region 13, and the area between the channel stop area 51 and the first well region 13 between the photosensor parts 21 in the vertical direction are the epitaxial region 12 of the P-type, as shown in FIG. 6, the places corresponding to the epitaxial region 12 in the potential graph in line B-B' and in line C-C' are recessed downward (in the direction of increasing the potential). However, in the place in which the potential graph is recessed downward, the existence of the second well region 14 allows the excess holes accumulated in a deeper place from the substrate surface than the position at which the potential is the maximum to flow into the second well region 14 and evacuate outside.

On the other hand, electrons photoelectrically converted below the vertical charge transfer part 41 and below the channel stop area 51 between the photosensor parts 21 in the vertical direction do not go to the semiconductor substrate 11 side, and the electrons flow into each of the vertical charge transfer parts 41 and a single photosensor part 21 corresponding to each of the channel stop areas 51 between the photosensor parts 21 in the vertical direction. Thus, the sensitivity of the solid state imaging device 1 is improved correspondingly. In addition, excess electrons pass through the first conductive region 15 and flow into the semiconductor substrate 11. Therefore, the blooming phenomenon in which excess electric charges leak into the vertical charge transfer part 41 can be suppressed. Here, the first well region 13 having a higher impurity concentration than that of the epitaxial region 12 becomes the overflow barrier.

In accordance with the solid state imaging device 1, according to the embodiment of the invention, the first well region 13 can be emptied out and the excess electrons can be drained from the semiconductor substrate 11 side through the first conductive region 15, and thus blooming can be suppressed. Moreover, the excess holes are allowed to evacuate from the front surface side of the substrate outside the image area 5 through the channel stop area 51 formed on the front surface side of the substrate, or from the front surface side of the substrate outside the image area 5 through the second well region 14. In addition to this, the second well region 14 is formed at a deeper position than the first well region 13 and the impurity concentration in the second well region 14 is made higher than that in the epitaxial region 12 and in the first well region 13, whereby the voltage drop is suppressed and the excess holes are allowed to partially flow into the outer part of the image area 5 through the second well region 14. Therefore, image quality variations (shading in the saturated signal electrons), which are caused by potential fluctuations between the center part and the surrounding area in the image area 5, can be suppressed.

Moreover, in accordance with the solid state imaging device 1, according to the embodiment of the invention, since the sensitivity can be improved, the pixel size can be more scaled down. In addition, since the excess holes generated in the deeper part of the substrate are allowed to evacuate from the front surface side of the substrate outside the image area 5 through the second well region 14, it is unnecessary to drain the excess holes generated in the deeper part of the substrate from the front surface side of the substrate outside the image area 5 through the channel stop area 51 formed on the front surface side of the substrate. Thus, it is unnecessary to form the P-type region 43 deeper from the substrate surface, the P-type region 43 being formed below the channel stop area 51 between the photosensor parts 21 in the vertical direction and below the vertical charge transfer part 41 (in the vertical charge transfer part 41, the area deeper than the vertical charge transfer channel formed in the N-type region 42 from the semiconductor substrate surface). Therefore, the narrow channel effect can be reduced, and the problem of using the method described in Patent Reference 2 does not occur. Accordingly, the pixel size can be more scaled down.

Next, a solid state imaging device according to a second embodiment of the invention will be described with reference to a cross section depicting the schematic configuration shown in FIG. 8.

Figure 8:
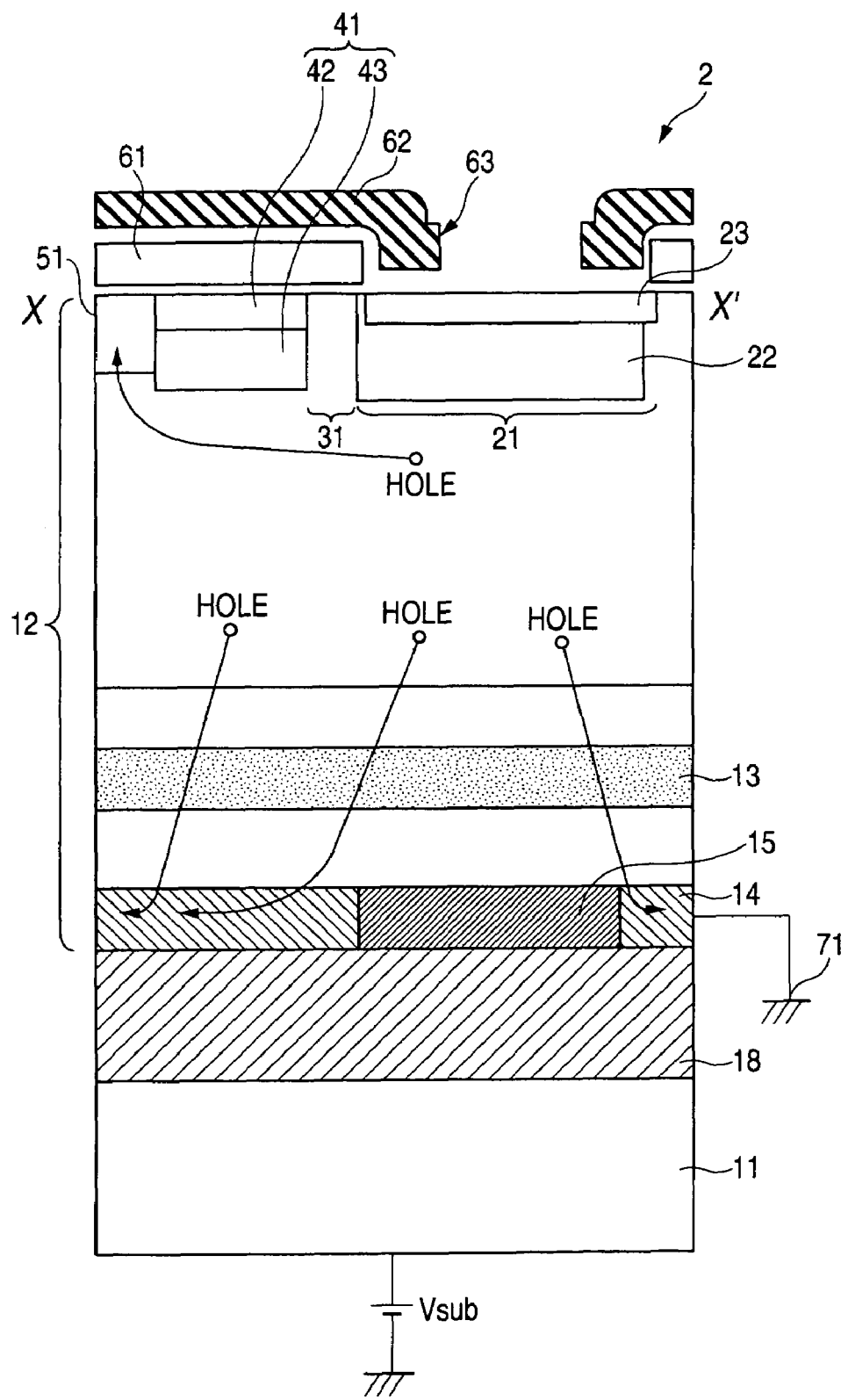
FIG. 8 shows a cross section depicting the schematic configuration of a light receiving pixel of a solid state imaging device according to an embodiment (second embodiment) of the invention.

As shown in FIG. 8, a solid state imaging device 2 is provided with a first conductive type (N-type) area 18 between the second well region 14 and the semiconductor substrate 11 in the solid state imaging device 1; and the area 18 has a concentration high enough to cancel the striation of a silicon substrate. Preferably, the concentration of the first conductive type region 18 (the concentration of the N-type impurity such as As or P) is about $2.0\times10^{16}$ cm$^{-3}$ to $5.0\times10^{17}$ cm$^{-3}$. For example, the first conductive type region 18 is formed in which an N-type impurity is ion injected into the semiconductor substrate 11. Although it is necessary to form the first conductive type region 18 at a deep position, 6 μm or deeper, from the surface of the light receiving area 23, it is difficult to form the area at a position 6 μm or deeper from the semiconductor substrate surface by ion injection such as As or P. Therefore, it is necessary that the first conductive type region 18 is formed in an area shallow from the semiconductor substrate surface by ion injection and, after that, the semiconductor area thereabove is formed by epitaxial growth. Thus, on the first conductive type region 18, an epitaxial region 12 is formed.

In the epitaxial region 12, by ion injection, for example, a first well region 13 of a second conductive type (P-type) is formed so as to be an overflow barrier with a higher impurity concentration than that of the epitaxial region 12. In addition, in the epitaxial region 12, on the surface on the opposite side of the semiconductor substrate 11, a photosensor part 21 is formed that photoelectrically converts the light incident into the solid state imaging device 2. The photosensor part 21 is configured of a photoelectric conversion area 22 formed of an N-type region and a light receiving area 23 that is a hole accumulation layer formed of a P$^+$-type region formed on the front layer of the photoelectric conversion area 22.

On one side of the photosensor part 21, a vertical charge transfer part 41 is formed through a readout part 31. The vertical charge transfer part 41 is formed of an N-type region 42, and a P-type region 43 is formed thereunder. Moreover, on one side of the vertical charge transfer part 41 opposite to the readout part 31, a channel stop area 51 formed of a P-type region is formed. In addition, a channel stop part (not shown) is also formed on the other side of the photosensor part 21.

Moreover, as apart from the first well region 13, a second well region 14 of a second conductive type (P-type) that has a higher impurity concentration than that of the first well region 13 is formed. In other words, on the opposite side of the photoelectric conversion area 22 with the first well region 13 being interposed therebetween, the second well region 14 is formed. Therefore, between the first well region 13 and the second well region 14, the epitaxial region 12 partially exists as the second conductive type region.

In addition to this, in the solid state imaging device 2, an image area is provided in which the photosensor parts 21 are formed in a matrix, and a ground part 71 is provided in the outer part of the image area.

The second well region 14 is formed so as to leave out the places corresponding to the photosensor parts 21. In other words, the second well region 14 is formed so as to leave out the areas in which the area functioning as the photosensor part 21 (for example, the light incident area of the light receiving area 23) is projected downward.

Therefore, the second well region 14 is formed in a mesh in the area corresponding to the image area 5 in which a plurality of the photosensor parts 21 is formed in a matrix. It is sufficient that the second well region 14 is formed so as to leave out the places corresponding to the photosensor parts 21. In the area in which the second well region 14 formed in a mesh is not provided, a first conductive region 15 is formed.

In addition, on the epitaxial region 12 in the readout part 31 and the vertical charge transfer part 41, an electrode (a transfer electrode and a readout electrode) 61 is formed through an insulating film (not shown). Moreover, a light shielding film 62 is formed through an insulating film (not shown), and on the photosensor part 21, an opening 63 is formed in the light shielding film 62.

Next, an imaging apparatus according to the embodiment of the invention will be described with reference to a block diagram shown in FIG. 9.

An imaging apparatus 101 has a solid state imaging device 111. On the light collecting side of the solid state imaging device 111, an image forming optical system 121 is provided, and to the solid state imaging device 111, a drive circuit 131 that drives the optical system 121 is connected. In addition, to the solid state imaging device 111, a signal processing circuit 141 that generates image signals from the signals photoelectrically converted in the solid state imaging device 111 is connected. The image signals generated by the signal processing circuit 141 are stored in an image storage part 151. In the imaging apparatus 101, the solid state imaging device 1 or the solid state imaging device 2 according to the embodiment of the invention can be used for the solid state imaging device 111.

Since the imaging apparatus 101 according to the embodiment of the invention uses the solid state imaging device 1 or the solid state imaging device 2 according to the embodiment of the invention for the imaging device, the apparatus 101 can obtain images of high sensitivity. Moreover, since the solid state imaging device 1 or the solid state imaging device 2 according to the embodiment of the invention is excellent in the dependency of sensitivity and spectral response on the voltage Vsub, the imaging apparatus 101 using the same can obtain stable images. In addition, in accordance with the solid state imaging device, 1 according to the embodiment of the invention, since the pixels can be more scaled down, the imaging apparatus 101 using the same can obtain images of higher definition than using a solid state imaging device in the same size before. Similarly, in the solid state imaging device 1 or the solid state imaging device 2, according to the embodiment of the invention, in the case of using the same pixel number, a prior solid state imaging device can be reduced in size as well. Therefore, the imaging apparatus 101 using the solid state imaging device 1 or the solid state imaging device 2 according to the embodiment of the invention can be more reduced in size than before.

Moreover, the imaging apparatus 101 according to the embodiment of the invention is not restricted to the above configurations, and it can be adapted to any configurations of imaging apparatuses as long as they use a solid state imaging device.

The solid state imaging devices 1 and 2 may be formed as one chip, or they may be a module with the imaging function, in which the imaging part, the signal processing part and/or the optical system are combined in a package. In addition, the embodiment of the invention can be adapted not only to the solid state imaging device but also to any imaging apparatus. In this case, as the imaging apparatus, the effect of higher image quality can be obtained. Here, the imaging apparatus means a camera and a cellular telephone having the imaging function, for example. In addition, the term "imaging" includes capturing images in general camera shooting as well as fingerprint detection in a broad sense.

It should be understood by those skilled in the art that various modifications, combinations, subcombinations and alterations may occur depending on design requirements and other factors insofar as they are within the scope of the appended claims or the equivalents thereof.

What is claimed is:

1. A solid state imaging device having an image area in which a plurality of light receiving pixels is arranged on a semiconductor substrate of a first conductive type, the solid state imaging device comprising:

a plurality of photosensor parts formed by providing on the semiconductor substrate a light receiving area and a photoelectric conversion area both configuring the light receiving pixel;

a first well region formed on the opposite side of the light receiving area with the photoelectric conversion area of the photosensor parts being interposed therebetween, having a second conductive type opposite to the first conductive type, and forming an overflow barrier;

a second well region of the second conductive type formed in an area except a place corresponding to the photosensor parts on the opposite side of the photoelectric conversion area with the first well region being interposed therebetween; and a first conductive region formed in an area corresponding to the photosensor parts on the opposite side of the photoelectric conversion area with the first well region being interposed therebetween.

2. The solid state imaging device according to claim 1, comprising:

a ground part provided in an outer part of the image area; and a second conductive region provided between the second well region and the ground part, wherein overflowed electric charges are partially carried to the ground part through the second well region.

3. The solid state imaging device according to claim 1, comprising:

an electric charge transfer part configured to transfer signal electric charges photoelectrically converted in the photosensor parts; and a channel stop part configured to perform pixel separation, wherein a potential in an area between the photosensor parts and the first well region is equal to or greater than a potential in an area between the electric charge transfer part or the channel stop part and the first well region, and a potential in the second well region is lower than a potential in the first well region.

4. The solid state imaging device according to claim 1, wherein the second well region is formed in a mesh in an area except a place corresponding to the photosensor parts.

5. The solid state imaging device according to claim 1, wherein the depth of the first conductive region from the surface of the light receiving area is the same as the depth of the second well region from the surface of the light receiving area.

6. The solid state imaging device according to claim 2, wherein in the outer part of the image area, a third well region of the second conductive type is provided between the second well region and the ground part.

7. A solid state imaging device having an image area in which a plurality of light receiving pixels is arranged on a semiconductor substrate of a first conductive type, the solid state imaging device comprising:

a ground part provided in an outer part of the image area;

a plurality of photosensor parts formed in which a light receiving area and a photoelectric conversion area both configuring the light receiving pixel are provided on the semiconductor substrate;

a first well region formed on the opposite side of the light receiving area with the photoelectric conversion area of the photosensor parts being interposed therebetween, having a second conductive type opposite to the first conductive type, and forming an overflow barrier; and a path configured to partially carry overflowed electric charges so as to pass through an area on the opposite side of the photoelectric conversion area with the first well region being interposed therebetween except a place corresponding to the photosensor parts and to partially carry overflowed electric charges to the ground part.

8. An imaging apparatus comprising a solid state imaging device as an imaging device, wherein the solid state imaging device includes an image area in which a plurality of light receiving pixels is arranged on a semiconductor substrate of a first conductive type, a plurality of photosensor parts formed in which a light receiving area and a photoelectric conversion area both configuring the light receiving pixel are provided on the semiconductor substrate, a first well region formed on the opposite side of the light receiving area with the photoelectric conversion area of the photosensor parts being interposed therebetween, having a second conductive type opposite to the first conductive type, and forming an overflow barrier, a second well region of the second conductive type formed in an area except a place corresponding to the photosensor parts on the opposite side of the photoelectric conversion area with the first well region being interposed therebetween, and a first conductive region formed in an area corresponding to the photosensor parts on the opposite side of the photoelectric conversion area with the first well region being interposed therebetween.

* * * * *